United States Patent
Hayashishita

(10) Patent No.: US 11,107,789 B2
(45) Date of Patent: Aug. 31, 2021

(54) METHOD FOR MANUFACTURING SEMICONDUCTOR DEVICE

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 523 days.

(21) Appl. No.: 16/089,753

(22) PCT Filed: Mar. 27, 2017

(86) PCT No.: PCT/JP2017/012478
§ 371 (c)(1),
(2) Date: Sep. 28, 2018

(87) PCT Pub. No.: WO2017/170451
PCT Pub. Date: Oct. 5, 2017

(65) Prior Publication Data
US 2020/0312810 A1 Oct. 1, 2020

(30) Foreign Application Priority Data
Mar. 30, 2016 (JP) .............................. JP2016-068859

(51) Int. Cl.
*H01L 21/683* (2006.01)
*H01L 23/00* (2006.01)
*H01L 23/482* (2006.01)

(52) U.S. Cl.
CPC .......... *H01L 24/48* (2013.01); *H01L 21/6835* (2013.01); *H01L 21/6836* (2013.01);
(Continued)

(58) Field of Classification Search
CPC ....... H01L 21/6835; H01L 2221/68327; H01L 2221/68386; H01L 2221/68354; H01L 2224/16145; H01L 2224/81815
See application file for complete search history.

(56) References Cited

U.S. PATENT DOCUMENTS 8,816,404 B2 8/2014 Kim et al.
10,014,235 B2 7/2018 Takamoto et al.
(Continued)

FOREIGN PATENT DOCUMENTS

JP 2002226796 A 8/2002
JP 2007208129 A 8/2007
(Continued)

OTHER PUBLICATIONS

The extended European search report dated Jan. 8, 2020, by the European Patent Office in corresponding European Patent Application No. 17774988.4. (11 pages).
(Continued)

*Primary Examiner* — Tucker J Wright
(74) *Attorney, Agent, or Firm* — Buchanan Ingersoll & Rooney PC

(57) ABSTRACT

A method for manufacturing a semiconductor device according to the present invention includes at least the following three steps: (A) a step of preparing a first structure (100) including an adhesive laminate film (50) having a heat-resistant resin layer (10), a flexible resin layer (20) and an adhesive resin layer (30) in this order, and a first semiconductor component (60) adhered to the adhesive resin layer (30) and having a first terminal (65); (B) a step of performing solder reflow processing on the first structure (100) in a state where the first semiconductor component (60) is adhered to the adhesive resin layer (30); and (C) a step of, (Continued)

after the step (B), peeling the heat-resistant resin layer (10) from the adhesive laminate film (50).

16 Claims, 7 Drawing Sheets

(52) U.S. Cl.
CPC .......... *H01L 23/4828* (2013.01); *H01L 24/11* (2013.01); *H01L 24/97* (2013.01); *H01L 2221/68327* (2013.01); *H01L 2221/68354* (2013.01); *H01L 2221/68386* (2013.01); *H01L 2224/16145* (2013.01)

(56) References Cited

U.S. PATENT DOCUMENTS

| | | | |
|---|---|---|---|
| 2012/0028418 A1* | 2/2012 | Asai | .................... H01L 21/6836 438/114 |
| 2012/0070658 A1 | 3/2012 | Ikishima et al. | |
| 2014/0084456 A1 | 3/2014 | Kang et al. | |
| 2015/0348820 A1 | 12/2015 | Taya et al. | |
| 2017/0018472 A1 | 1/2017 | Takamoto et al. | |

FOREIGN PATENT DOCUMENTS

| | | | |
|---|---|---|---|
| JP | 2013227435 | A | 11/2013 |
| JP | 2014143305 | A | 8/2014 |
| JP | 2015137299 | A | 7/2015 |
| JP | 2015170754 | A | 9/2015 |
| WO | 2012/053463 | A1 | 4/2012 |

OTHER PUBLICATIONS

International Search Report (PCT/ISA/210) dated May 9, 2017, by the Japanese Patent Office as the International Searching Authority for International Application No. PCT/JP2017/012478.

Written Opinion (PCT/ISA/237) dated May 9, 2017, by the Japanese Patent Office as the International Searching Authority for International Application No. PCT/JP2017/012478.

\* cited by examiner

50

METHOD FOR MANUFACTURING SEMICONDUCTOR DEVICE

TECHNICAL FIELD

The present invention relates to a method for manufacturing a semiconductor device.

BACKGROUND ART

Accompanying with high integration of semiconductor devices in recent years, chip-on-chip in which a plurality of semiconductor chips are stacked and mounted in a single package, chip-on-wafer in which a semiconductor chip is mounted on a semiconductor wafer, wafer-on-wafer in which a semiconductor wafer is mounted on a semiconductor wafer, and the like have been proposed.

In such a manufacturing process of a semiconductor device, semiconductor components such as a semiconductor chip and a semiconductor wafer may be bonded to each other by solder reflow processing using a solder bump in some cases.

As a technique related to bonding by the solder reflow processing using the solder bump, for example, one described in Patent Document 1 (Japanese Published patent application No. A-2014-143305) can be mentioned.

Patent Document 1 discloses a mounting structure of a semiconductor device in which a semiconductor element is mounted on a mounting substrate in a state where an electrode part formed on an upper surface of the mounting substrate and an electrode part formed on an upper surface of the semiconductor element are electrically connected, which is provided with a convex bump including a column bump post composed of a refractory metal having one end connected to one of the electrode parts of the semiconductor element and the mounting substrate, and a first barrier layer covering an upper surface and a side surface of the other end of the bump post; and a concave bump including a second barrier layer formed on the other electrode part of the semiconductor element and the mounting substrate, and a solder member composed of a low melting point solder which connects the upper surface and the side surface covered with the second barrier layer and the first barrier layer of the convex bump.

RELATED DOCUMENT

Patent Document

[Patent Document 1] Japanese Published Patent Application No. A-2014-143305

SUMMARY OF THE INVENTION

Technical Problem

According to the studies of the present inventors, the following problems have been found from the method for manufacturing a semiconductor device in the related art.

First, the present inventors have found out that in the method for manufacturing a semiconductor device in the related art, in a case where semiconductor components are bonded to each other by solder reflow processing using a solder bump, an adhesive film for fixing the semiconductor components is deformed or melted. In this case, a positional deviation of the semiconductor component on the adhesive film occurs, and thereafter, it is difficult to easily pick up the semiconductor component.

Further, according to the studies of the present inventors, it has become apparent that in a case where a heat resistance of the adhesive film is increased in order to suppress deformation and melting of the adhesive film, deformation and melting of the adhesive film are suppressed, and the positional deviation of the semiconductor component is reduced, but deterioration of the stretchability and flexibility of the adhesive film is also caused, and thus the semiconductor component cannot be easily picked up.

That is, the method for manufacturing a semiconductor device in the related art, there is a room for improvement in the pickup performance of the semiconductor component after the solder reflow processing using the solder bump.

Therefore, in the method for manufacturing a semiconductor device in the related art, from the viewpoint of easily performing the solder reflow processing using the solder bump and picking up the semiconductor component, as shown in FIG. 7, a semiconductor component 70A on an adhesive film 50A is to be once moved onto a tray 80A or the like, and is to be placed in a solder reflow furnace 90A, and the solder reflow processing using a solder bump 68A is to be performed, and thereafter the obtained semiconductor component 70B is to be again moved onto the adhesive film 50A or the like and to be subjected to a dicing step or a pickup step, accordingly, the manufacturing steps are complicated.

That is, the present inventors have found that in the method for manufacturing a semiconductor device in the related art, there is a room for improvement from the viewpoint of compatibility of simplification of steps from the solder reflow step to the pickup step of the semiconductor component and pickup performance of the semiconductor component.

The present invention has been made in view of the above described circumstances, and the present invention is to provide a method for manufacturing a semiconductor device capable of simplifying the steps from the solder reflow step to the pickup step of the semiconductor component and picking up the semiconductor component with a high precision.

Solution to Problem

The present inventors have conducted intensive studies to achieve the above object. As a result, the present inventors found that an adhesive laminate film having a heat-resistant resin layer, a flexible resin layer and an adhesive resin layer in this order is used as a film for fixing the semiconductor component, and before the step of picking up the semiconductor component, the heat-resistant resin layer is peeled, and therefore both the simplification of the steps from the solder reflow step to the pickup step of the semiconductor component and the pickup performance of the semiconductor component can be compatible, and completed the present invention.

According to the present invention, there is provided a method for manufacturing a semiconductor device as follows.

[1]

A method for manufacturing a semiconductor device including:

(A) a step of preparing a first structure including an adhesive laminate film having a heat-resistant resin layer, a flexible resin layer and an adhesive resin layer in this order, and a first semiconductor component adhered to the adhesive resin layer and having a first terminal;

(B) a step of performing solder reflow processing on the first structure in a state where the first semiconductor component is adhered to the adhesive resin layer; and (C) a step of, after the step (B), peeling the heat-resistant resin layer from the adhesive laminate film.

[2]

The method for manufacturing a semiconductor device according to [1], in which the step (B) includes a step of obtaining a second structure by bonding a solder bump to the first terminal of the first semiconductor component.

[3]

The method for manufacturing a semiconductor device according to [2], in which the step (B) includes a step of obtaining the second structure by bonding a second terminal of a second semiconductor component which is separately prepared to the first terminal of the first semiconductor component via the solder bump.

[4]

The method for manufacturing a semiconductor device according to [2] or [3], in which in the step (B), the solder reflow processing is performed under a temperature environment equal to or more than 180° C. and equal to or less than 300° C.

[5]

The method for manufacturing a semiconductor device according to any one of [2] to [4], in which the first semiconductor component includes a semiconductor substrate, and the method further includes (D) a step of, between the step (B) and the step (C), dicing the second structure to obtain a plurality of third semiconductor components.

[6]

The method for manufacturing a semiconductor device according to [5], further including:

(E) a step of, after the step (C), picking up the third semiconductor components from the adhesive resin layer.

[7]

The method for manufacturing a semiconductor device according to any one of [2] to [4], in which the second structure includes a plurality of third semiconductor components, and the method further includes (E) a step of, after the step (C), picking up the third semiconductor components from the adhesive resin layer.

[8]

The method for manufacturing a semiconductor device according to [6] or [7], further including:

(F) a step of, between the step (B) and the step (E), irradiating the adhesive laminate film with a radiation to crosslink the adhesive resin layer, thereby reducing adhesive force of the adhesive resin layer to the third semiconductor components.

[9]

The method for manufacturing a semiconductor device according to any one of [6] to [8], in which in the step (E), in a state where a region to which the third semiconductor components are adhered in the adhesive resin layer is expanded in an in-plane direction of the film to enlarge an interval between the third semiconductor components adjacent to each other, the third semiconductor components are picked up from the adhesive resin layer.

[10]

The method for manufacturing a semiconductor device according to any one of [5] to [9], further including:

(G) a step of, between the step (B) and the step (C), confirming an operation of the third semiconductor components in a state of being adhered to the adhesive resin layer.

[11]

The method for manufacturing a semiconductor device according to any one of [1] to [10], in which a melting point of the heat-resistant resin layer is equal to or more than 200° C., or the heat-resistant resin layer has no melting point.

[12]

The method for manufacturing a semiconductor device according to any one of [1] to [11], in which a melting point of the flexible resin layer is equal to or more than 100° C. and equal to or less than 250° C.

[13]

The method for manufacturing a semiconductor device according to any one of [1] to [12], in which the heat-resistant resin constituting the heat-resistant resin layer contains one or more selected from the group consisting of polyimide, polyamide, and polyester.

[14]

The method for manufacturing a semiconductor device according to any one of [1] to [13], in which the flexible resin constituting the flexible resin layer contains one or more selected from the group consisting of a polyester elastomer, a polyamide elastomer, a polyimide elastomer, and a polybutylene terephthalate.

[15]

The method for manufacturing a semiconductor device according to any one of [1] to [14], in which the adhesive constituting the adhesive resin layer contains one or more selected from a (meth)acrylate adhesive, a silicone adhesive, a urethane adhesive, an olefin adhesive, and a styrene adhesive.

[16]

The method for manufacturing a semiconductor device according to any one of [1] to [15], in which a total light transmittance of the adhesive laminate film is equal to or more than 85%.

Advantageous Effects of Invention

According to the present invention, there is provided a method for manufacturing a semiconductor device capable of simplifying steps from the solder reflow step to the pickup step of the semiconductor component and picking up the semiconductor component with a high precision.

BRIEF DESCRIPTION OF THE DRAWINGS

The above described object and other objects, features, and advantages will become more apparent from the following description of the preferred embodiments and accompanying drawings.

DESCRIPTION OF EMBODIMENTS

Figure 1:
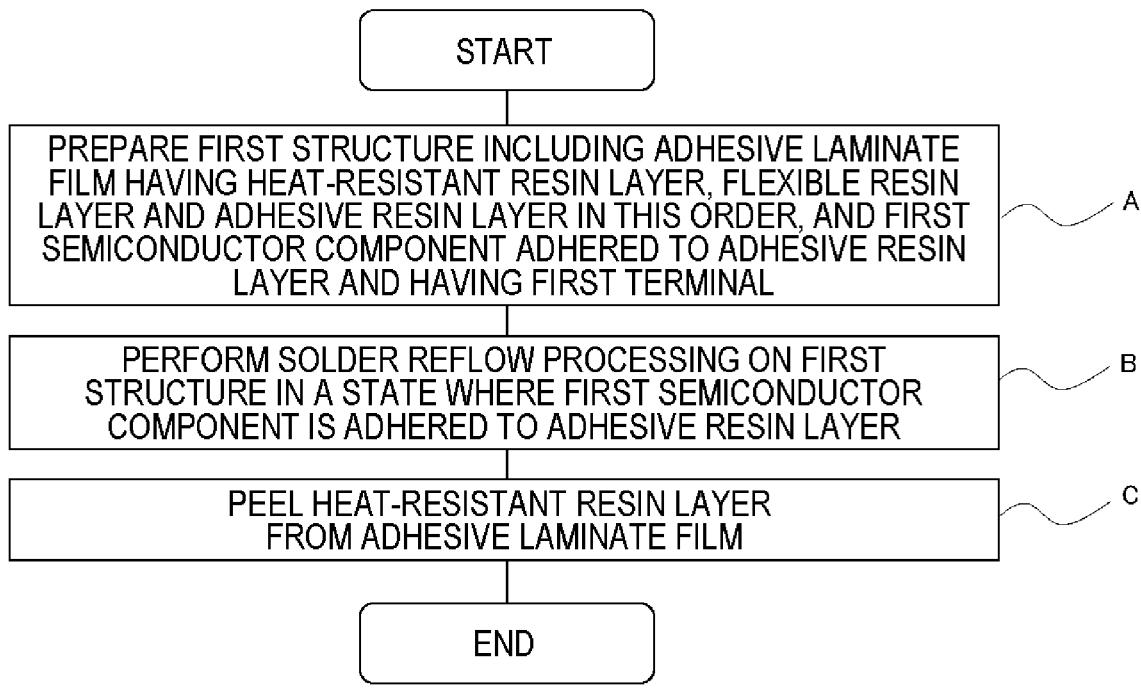
FIG. 1 is a flowchart showing an example of a method for manufacturing a semiconductor device according to the present invention.

Hereinafter, embodiments of the present invention will be described with reference to drawings. In all drawings, the same reference numerals are given to the same configuration elements, and the detailed description thereof will not be repeated. Also, the drawings are schematic ones and do not match the actual dimensions. "A to B" in the numerical range represents equal to or more than A and equal to or less than B unless otherwise specified. In the present embodiment, "(meth)acrylic" means acrylic, methacrylic or both acrylic and methacrylic.

Figure 5:
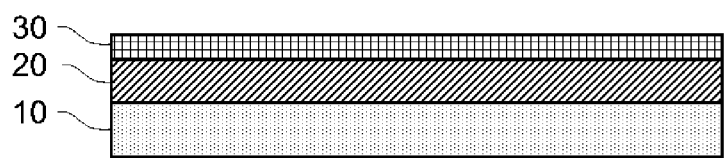
FIG. 5 is a cross-sectional view schematically showing an example of a structure of an adhesive laminate film according to an embodiment of the present invention.
Figure 6:
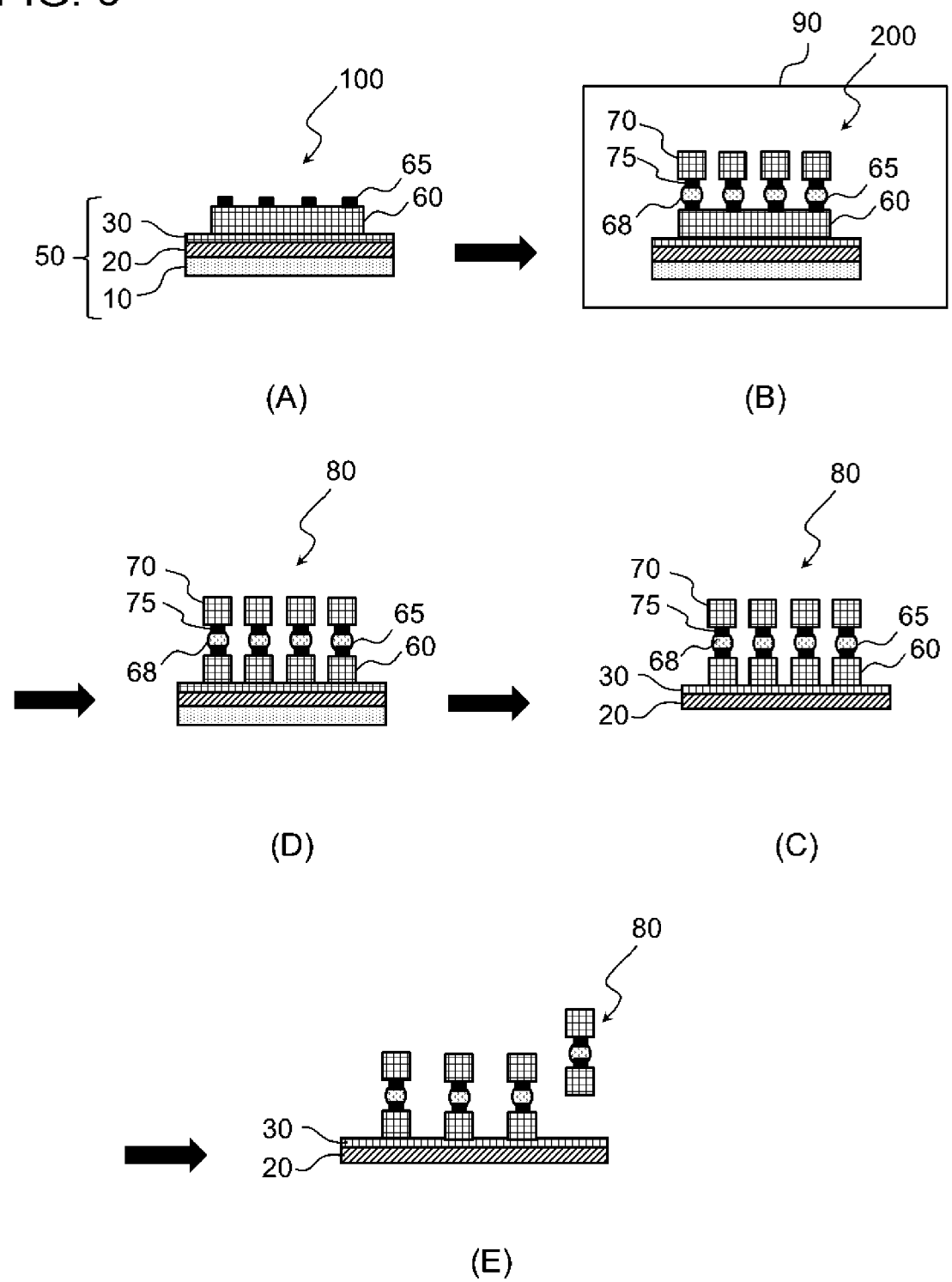
FIG. 6 is a cross-sectional view schematically showing an example of the method for manufacturing a semiconductor device according to an embodiment of the present invention.

FIGS. 1 to 4 are each a flowchart showing an example of a method for manufacturing a semiconductor device according to the present invention. FIG. 5 is a cross-sectional view schematically showing an example of a structure of an adhesive laminate film 50 according to an embodiment of the present invention. FIG. 6 is a cross-sectional view schematically showing an example of the method for manufacturing a semiconductor device according to an embodiment of the present invention.

The method for manufacturing a semiconductor device according to the present embodiment includes at least the following three steps:

(A) a step of preparing a first structure 100 including an adhesive laminate film 50 having a heat-resistant resin layer 10, a flexible resin layer 20 and an adhesive resin layer 30 in this order, and a first semiconductor component 60 adhered to the adhesive resin layer 30 and having a first terminal 65;

(B) a step of performing solder reflow processing on the first structure 100 in a state where the first semiconductor component 60 is adhered to the adhesive resin layer 30; and (C) a step of, after the step (B), peeling the heat-resistant resin layer 10 from the adhesive laminate film 50.

According to the studies of the present inventors, the following problems have been found from the method for manufacturing a semiconductor device in the related art.

First, the present inventors have found out that in the method for manufacturing a semiconductor device in the related art, in a case where semiconductor components are bonded to each other by solder reflow processing using a solder bump, an adhesive film for fixing the semiconductor components is deformed or melted. In this case, a positional deviation of the semiconductor component on the adhesive film occurs, and thereafter, it is difficult to easily pick up the semiconductor component.

Further, according to the studies of the present inventors, it has become apparent that in a case where a heat resistance of the adhesive film is increased in order to suppress deformation and melting of the adhesive film, deformation and melting of the adhesive film are suppressed, and the positional deviation of the semiconductor component is reduced, but deterioration of the stretchability and flexibility of the adhesive film is also caused, and thus the semiconductor component cannot be easily picked up.

That is, the method for manufacturing a semiconductor device in the related art, there is a room for improvement in the pickup performance of the semiconductor component after the solder reflow processing using the solder bump.

Figure 7:
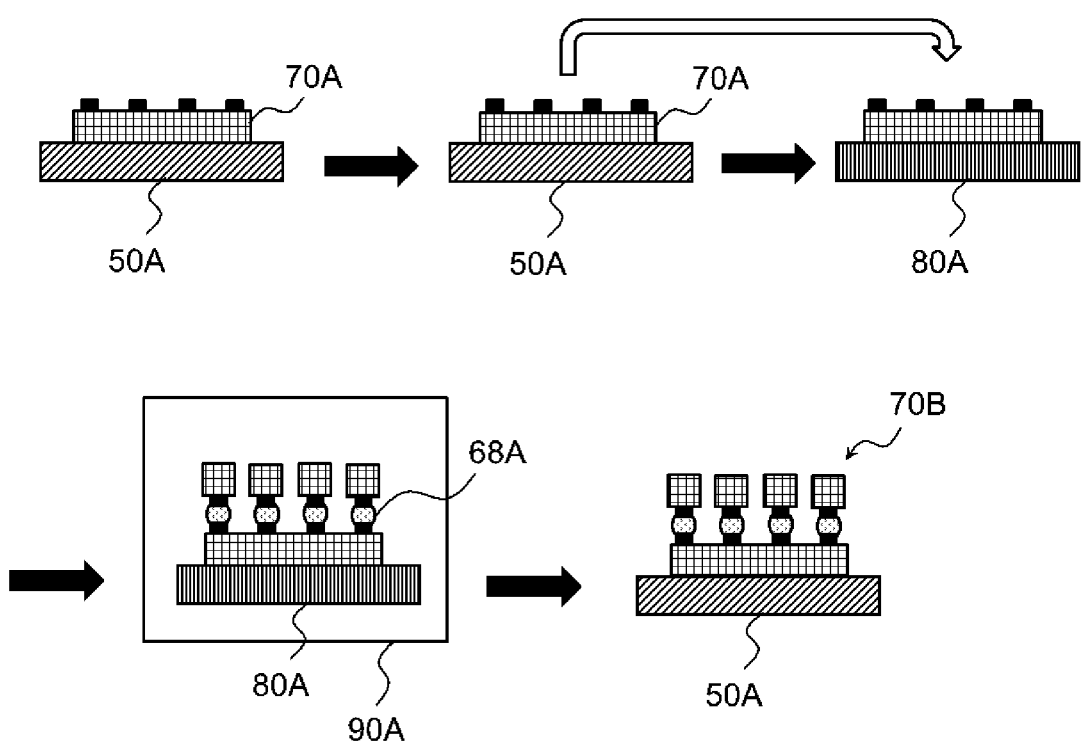
FIG. 7 is a cross-sectional view schematically showing an example of a method for manufacturing a semiconductor device in the related art.

Therefore, in the method for manufacturing a semiconductor device in the related art, from the viewpoint of easily performing the solder reflow processing using the solder bump and picking up the semiconductor component, as shown in FIG. 7, a semiconductor component 70A on an adhesive film 50A is to be once moved onto a tray 80A or the like, and is to be placed in a solder reflow furnace 90A, and the solder reflow processing using a solder bump 68A is to be performed, and thereafter the obtained semiconductor component 70B is to be again moved onto the adhesive film 50A or the like and to be subjected to a dicing step or a pickup step, accordingly, the manufacturing steps are complicated.

That is, the present inventors have found that in the method for manufacturing a semiconductor device in the related art, there is a room for improvement from the viewpoint of compatibility of simplification of steps from the solder reflow step to the pickup step of the semiconductor component and pickup performance of the semiconductor component.

The present inventors have conducted intensive studies to achieve the above object. As a result, the present inventors found that an adhesive laminate film 50 having a heat-resistant resin layer 10, a flexible resin layer 20 and an adhesive resin layer 30 in this order is used as a film for fixing the semiconductor component, and before the step of picking up the semiconductor component, the heat-resistant resin layer 10 is peeled, and therefore both the simplification of the steps from the solder reflow step to the pickup step of the semiconductor component and the pickup performance of the semiconductor component can be compatible.

That is, by performing the above step (B) using the adhesive laminate film 50 having the heat-resistant resin layer 10, deformation and melting of the adhesive resin layer 30 are suppressed due to the heat-resistant resin layer 10, and the positional deviation of the semiconductor component can be suppressed, whereby precise picking up of the semiconductor component is realized.

Since the heat-resistant resin layer 10 having an inferior stretchability and flexibility is removed by performing the step (C) after the step (B), in the step of picking up the semiconductor component, the stretchability and flexibility of the film including the adhesive resin layer 30 and the flexible resin layer 20 becomes favorable, and thus the pickup of the semiconductor component can be performed more easily.

Furthermore, since it is possible to perform the solder reflow processing on the semiconductor component in a state of being adhered to the adhesive laminate film 50, it is unnecessary to move the semiconductor component to a tray or the like from the adhesive laminate film 50 before the solder reflow processing of the semiconductor component and steps from the solder reflow step to the pickup step of the semiconductor component can be simplified.

As described above, according to the method for manufacturing a semiconductor device in the present embodiment, by including the steps (A) to (C), steps from the solder reflow step to the pickup step of the semiconductor component can be simplified and thus picking up the semiconductor component with a high precision is realized.

1. Adhesive Laminate Film

First, an adhesive laminate film 50 used in the method for manufacturing a semiconductor device according to the present embodiment will be described.

Here, in the present embodiment, the term "heat resistance" means a dimensional stability of a film or a resin layer at high temperature. That is, a film or a resin layer having excellent heat resistance means that the film or the resin layer is less likely to have deformation or melting such as expansion, contraction, softening, or the like at high temperature.

<Heat-Resistant Resin Layer>

The heat-resistant resin layer 10 is a layer provided for the purpose of further improving properties such as handleability, mechanical properties, and heat resistance of the adhesive laminate film 50.

The heat-resistant resin layer 10 is not particularly limited as long as it has heat resistance enough to prevent deformation and melting to such an extent that positional deviation of the semiconductor component occurs in a case where performing the solder reflow processing. For example, heat-resistant resin film may be used.

Examples of the resin constituting the heat-resistant resin film include one or more selected from polyesters such as polyethylene terephthalate, polybutylene terephthalate, and polyethylene naphthalate; polyamides such as nylon-6, nylon-66, and polymetaxylene adipamide; polyimide; polyetherimide; polyamido imide; polycarbonate; modified polyphenylene ether; polyacetal; polyallylate; polysulfone; polyethersulfone; polyphenylene sulfide; polyetheretherketone; fluorine resin; liquid crystal polymer; vinylidene chloride resin; polybenzimidazole; polybenzoxazole; and poly methyl pentene.

Among them, one or more selected from polyimide, polyamide, and polyester are preferable from the viewpoint of excellent balance of heat resistance, mechanical strength, transparency, price, and the like.

The melting point of the heat-resistant resin layer 10 is preferably equal to or more than 200° C., and more preferably equal to or more than 220° C. Alternatively, the heat-resistant resin layer 10 preferably has no melting point, more preferably has a decomposition temperature of equal to or more than 200° C., and still more preferably has a decomposition temperature of equal to or more than 220° C.

By using such a heat-resistant resin layer 10, the deformation of the adhesive laminate film 50 can further be suppressed in a case of performing the solder reflow processing.

The heat-resistant resin layer 10 may be single layered or two or more layered.

The form of the resin film used for forming the heat-resistant resin layer 10 may be a stretched film or a film stretched in a uniaxial direction or biaxial direction, and it is preferable that the film be stretched in the uniaxial direction or the biaxial direction from the viewpoint of improving the heat resistance and the mechanical strength of the heat-resistant resin layer 10.

The thickness of the heat-resistant resin layer 10 is preferably equal to or more than 10 μm and equal to or less than 1000 μm, more preferably equal to or more than 10 μm and equal to or less than 500 μm, still more preferably equal to or more than 20 μm and equal to or less than 300 μm, from the viewpoint of obtaining favorable film characteristics.

The heat-resistant resin layer 10 may be subjected to a surface treatment in order to improve the adhesiveness to other layers. Specifically, corona treatment, plasma treatment, undercoat treatment, primer coating treatment, and the like may be performed.

The heat-resistant resin layer 10 is laminated on the flexible resin layer 20 in a peelable way.

The method for stacking in a peelable way is not particularly limited, and for example, a method for stacking through a peelable adhesive layer (not shown), and a method for adjusting the surface roughness of the surface of the heat-resistant resin layer 10 on the side in contact with the flexible resin layer 20 and having the surface thereof subjected to release treatment, and the like can be mentioned. The term "peelable adhesive layer" refers to a layer that can be easily peeled by any sort of application of stimulation such as radiation or heat during peeling.

Examples of such a peelable adhesive layer include (1) an adhesive layer composed of a radiation-crosslinking type adhesive which can suppress the strengthening of the adhesive force by irradiation of radiation, (2) an adhesive layer constituted by a heat-expansion type adhesive which is allowed to expand upon heating and suppress the strengthening of the adhesive force, (3) an adhesive layer which is constituted by a double-sided adhesive film with a shrinkable film as a base material, is shrunk by heating, and can suppress the strengthening of the adhesive force, and (4) a heat-resistant adhesive layer which can suppress the strengthening of the adhesive force even after treatment at high temperature or low temperature.

((1) Adhesive Layer Constituted by Radiation-Crosslinking Type Adhesive Capable of Suppressing Strengthening of Adhesive Force by Radiation Irradiation)

The radiation-crosslinking type adhesive has sufficient adhesive force to the heat-resistant resin layer 10 and the flexible resin layer 20 before the radiation irradiation and can suppress strengthening of the adhesive force after the radiation irradiation. That is, the heat-resistant resin layer 10 and the flexible resin layer 20 can be adhered to each other before the radiation irradiation, and the heat-resistant resin layer 10 can be easily peeled from the flexible resin layer 20 after the radiation irradiation.

As the radiation-crosslinking type adhesive, typically, a radiation-crosslinking type adhesive such as a known ultraviolet-crosslinking type adhesive or the like may be used.

((2) Adhesive Layer Constituted by Heat-Expansion Type Adhesive Capable of Suppressing Strengthening of Adhesive Force by Layer Expanding Upon Heating)

The term "heat-expansion type adhesive" refers to an adhesive in which thermally expandable fine particles, a blowing agent, or the like is dispersed in an adhesive. As the adhesive, generally known adhesives may be used, and examples thereof include (meth)acrylic adhesives, silicone adhesives, rubber adhesives, polyurethane adhesives, and polyvinyl ether adhesives.

As the thermally expandable fine particles, for example, fine particles in which a material that can be easily gasified and expanded by heating such as isobutane, propane, pentane, or the like is enclosed in an elastic shell can be mentioned.

As the blowing agent, for example, chemical substances having the ability to generate water, carbon dioxide gas, nitrogen by pyrolysis, and the like can be mentioned.

In a case where the thermally expandable fine particles or the blowing agent are expanded by heating, the surface state of the adhesive layer changes, and thus the strengthening of the adhesive force between the flexible resin layer 20 and the heat-resistant resin layer 10 can be suppressed. As a result, the heat-resistant resin layer 10 can be easily peeled from the flexible resin layer 20.

((3) Adhesive Layer Constituted by a Double-Sided Adhesive Film with a Shrinkable Film as a Base Material, and Capable of Suppressing Strengthening of Adhesive Force by Shrinkage Upon Heating)

As a shrinkable film used for a double-sided adhesive film with a shrinkable film as a base material, a heat shrinkable film shrinking by heating can be mentioned. A uniaxial or biaxially stretched films formed of, for example, polyethylene terephthalate, polyethylene, polystyrene, polypropylene, polyamide, polyurethane, polyvinyl chloride, polyvinylidene chloride or the like can be mentioned.

As the adhesive provided on both sides of the shrinkable film, generally known adhesives may be used; examples thereof include (meth)acrylic adhesives, silicone adhesives, rubber adhesives, polyurethane adhesives, and polyvinyl ether adhesives.

In a case where the shrinkable film of the base material shrinks upon heating, the surface state of the adhesive layer changes, and thus strengthening of the adhesive force between the flexible resin layer 20 and the heat-resistant resin layer 10 can be suppressed. As a result, the heat-resistant resin layer 10 can be easily peeled from the flexible resin layer 20.

((4) Heat-Resistant Adhesive Layer Capable of Suppressing Strengthening of Adhesive Force Even after Treatment at High Temperature or Low Temperature)

Examples of an adhesive constituting a heat-resistant adhesive layer which can suppress the strengthening of the adhesive force even after treatment at high temperature or low temperature include a (meth)acrylic adhesive, a silicone adhesive, a urethane adhesive, an olefin adhesive, and a styrene adhesive.

Here, the (meth)acrylic adhesive contains a (meth)acrylic adhesive resin as an essential component. The silicone adhesive contains a silicone adhesive resin as an essential component. The urethane adhesive contains a urethane adhesive resin an essential component.

Among them, a (meth)acrylic adhesive is preferable from the viewpoint of easier adjustment of the peeling strength between the heat-resistant resin layer 10 and the flexible resin layer 20.

Examples of the (meth)acrylic adhesive resin used in the (meth)acrylic adhesive include a (meth)acrylic acid alkyl ester monomer unit (A) and a monomer unit (B) having a functional group capable of reacting with a crosslinking agent.

In the present embodiment, the (meth)acrylic acid alkyl ester means an acrylic acid alkyl ester, a methacrylic acid alkyl ester, or a mixture thereof.

The (meth)acrylic adhesive resin according to the present embodiment can be obtained by copolymerizing a monomer mixture containing a (meth)acrylic acid alkyl ester monomer (A) and a monomer (B) having a functional group capable of reacting with a crosslinking agent.

As the monomer (A) forming the (meth)acrylic acid alkyl ester monomer unit (A), (meth)acrylic acid alkyl ester having an alkyl group having about 1 to 12 carbon atoms can be mentioned. (Meth)Acrylic acid alkyl ester having an alkyl group having 1 to 8 carbon atoms is preferable. Specifically, examples thereof include methyl acrylate, methyl methacrylate, ethyl acrylate, ethyl methacrylate, butyl acrylate, butyl methacrylate, 2-ethylhexyl acrylate, and 2-ethylhexyl methacrylate. These maybe used singly, or two or more thereof may be used.

In the (meth)acrylic adhesive resin according to the present embodiment, the content of the (meth)acrylic acid alkyl ester monomer unit (A) is preferably equal to or more than 10% by mass and equal to or less than 98.9% by mass, and more preferably equal to or more than 85 mass % and equal to or less than 95 mass %, with respect to the total of all the monomer units in the (meth)acrylic adhesive resin as 100% by mass.

As the monomer (B) forming the monomer (B) having a functional group capable of reacting with the crosslinking agent, acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, and tert-butylaminoethyl methacrylate can be mentioned. Acrylic acid, methacrylic acid, 2-hydroxyethyl acrylate, 2-hydroxyethyl methacrylate, acrylamide, methacrylamide and the like are preferable. These may be used singly, or two or more thereof may be used.

In the (meth)acrylic adhesive resin according to the present embodiment, the content of the monomer unit (B) is preferably equal to or more than 1% by mass and equal to or less than 40% by mass, more preferably equal to or more than 1% by mass and equal to or less than 20% by mass, and still more preferably equal to or more than 1% by mass and equal to or less than 10% by mass, with respect to the total of all the monomer units in the (meth)acrylic adhesive resin as 100% by mass.

In addition to the monomer unit (A) and the monomer unit (B), the (meth)acrylic adhesive resin according to the present embodiment may further contain a bifunctional monomer (C) or a specific comonomer having properties as a surfactant (hereinafter referred to as polymerizable surfactant) unit.

The polymerizable surfactant has a property of being copolymerized with the monomer (A), the monomer (B), and the monomer (C), and acts as an emulsifier in a case of emulsion polymerization.

Examples of the monomer (C) forming the bifunctional monomer unit (C) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate and ones in which with diacrylate or dimethacrylate at both ends, the main chain has propylene glycol type structure (for example, manufactured by NOF Corporation, trade name: PDP-200, PDP-400, ADP-200, ADP-400), tetramethylene glycol type structure (for example, manufactured by NOF Corporation, trade name: ADT-250 and ADT-850), and mixed type thereof (for example, manufactured by NOF Corporation, trade name: ADET-1800, ADPT-4000).

In the (meth)acrylic adhesive resin according to the present embodiment, the content of the monomer unit (C) is preferably equal to or more than 0.1% by mass and equal to or less than 30% by mass, more preferably equal to or more than 0.1% by mass to equal to or less than 5% by mass, with respect to the total of all the monomer units in the (meth) acrylic adhesive resin as 100% by mass.

Examples of the polymerizable surfactant include those obtained by introducing polymerizable 1-propenyl group to the benzene ring of polyoxyethylene nonylphenyl ether (manufactured by DKS Co. Ltd., trade name: Aqualon RN-10, RN-20, RN-30, RN-50, and the like), those obtained by introducing polymerizable 1-propenyl group into the benzene ring of an ammonium salt of sulfuric acid ester of polyoxyethylene nonylphenyl ether (manufactured by DKS Co. Ltd., trade name: Aqualon HS-10, HS-20, HS-1025, and the like), and sulfosuccinic acid diester having a polymerizable double bond in the molecule (manufactured by Kao Corporation trade name: Latemul S-120A, S-180A, and the like).

The (meth)acrylic adhesive resin according to the present embodiment may contain a monomer unit formed of a monomer having a polymerizable double bond such as vinyl acetate, acrylonitrile, and styrene if necessary.

Examples of the polymerization reaction mechanism of the (meth)acrylic adhesive resin according to the present embodiment include radical polymerization, anionic polymerization, and cationic polymerization. Considering the production cost of the (meth)acrylic adhesive resin, the influence of the functional group of the monomer, and the like, it is preferable to polymerize by radical polymerization.

In a case of the polymerization by a radical polymerization reaction, examples of radical polymerization initiator include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butyl peroxy phthalate, t-butyl peroxybenzoate, di-t-butyl peroxyacetate, t-butyl peroxy isobutylate, t-butyl peroxy-2-hexanoate, t-butyl peroxy-2-ethyl hexanoate, t-butyl peroxy-3,5,5-trimethyl hexanoate, acetyl peroxide, isobutyryl peroxide, octanoyl peroxide, t-butyl peroxide and di-t-amyl peroxide; inorganic peroxides such as ammonium persulfate, potassium persulfate, sodium persulfate and the like; and azo compounds such as 2,2'-azobisisobutyronitrile, 2,2'-azobis-2-methylbutyronitrile, and 4,4'-azobis-4-cyanovaleric acid.

In a case of polymerization by emulsion polymerization, among these radical polymerization initiators, inorganic peroxides such as water-soluble ammonium persulfate, potassium persulfate, sodium persulfate and the like, and an azo compound having a carboxyl group in the molecule such as water-soluble 4,4'-azobis-4-cyanovaleric acid is preferable, azo compounds having a carboxyl group in the molecule such as ammonium persulfate and 4,4'-azobis-4-cyanovaleric acid is more preferable, and azo compounds having a carboxyl group in the molecule such as 4,4'-azobis-4-cyanovaleric acid are particularly preferable.

In addition to the (meth)acrylic adhesive resin, the (meth) acrylic adhesive preferably further contains a crosslinking agent having two or more crosslinking functional groups in one molecule.

A crosslinking agent having two or more crosslinking functional groups in one molecule is used for reacting with a functional group of the (meth)acrylic adhesive resin and adjusting the adhesive force and the cohesive force.

Examples of such a crosslinking agent include epoxy compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcin syndiglycidyl ether and the like; isocyanate compounds such as tetramethylene diisocyanate, hexamethylene diisocyanate, tolylene diisocyanate 3 adduct of trimethylol propane, polyisocyanate, diphenylmethane diisocyanate, tolylene diisocyanate and the like; aziridine compounds such as trimethylolpropane tri-β-aziridinyl propionate, tetramethylolmethane-tri-β-aziridinyl propionate, N, N'-diphenylmethane-4,4'-bis (1-aziridinecarboxamide), N,N'-hexamethylene-1,6-bis (1-aziridinecarboxamide), N,N'-toluene-2,4-bis (1-aziridinecarboxamide), trimethylolpropane-β-(2-methylaziridine) propionate and the like; tetrafunctional epoxy compounds such as N,N, N',N'-tetraglycidyl-m-xylenediamine and 1,3-bis (N,N'-diglycidylaminomethyl) cyclohexane; and melamine compounds such as hexamethoxymethylol melamine. These may be used singly, or in combination of two or more thereof.

Among these, it is preferable that one or more selected from an epoxy compound, an isocyanate compound, and an aziridine compound be contained.

The content of the crosslinking agent in the (meth)acrylic adhesive is preferably equal to or more than 10 parts by mass and equal to or less than 50 parts by mass, more preferably equal to or more than 12 parts by mass and equal to or less than 30 parts by mass with respect to 100 parts by mass of the (meth)acrylic resin from the viewpoint of improving the balance with heat resistance and adhesive force of the adhesive layer.

By adjusting the content of the crosslinking agent in the (meth)acrylic adhesive, the peeling strength between the heat-resistant resin layer 10 and the flexible resin layer 20 can be adjusted.

The (meth)acrylic adhesive according to the present embodiment may further contain an ultraviolet polymerization initiator in addition to the adhesive resin. In doing so, the curing time and ultraviolet radiation dose by ultraviolet radiation can be reduced.

Examples of ultraviolet polymerization initiators include acetophenone based photopolymerization initiators such as methoxy acetophenone; α-ketol compounds such as 4-(2-hydroxyethoxy) phenyl (2-hydroxy-2-propyl) ketone; ketal compounds such as benzyl dimethyl ketal; benzoin based photopolymerization initiators such as benzoin, benzoin methyl ether, benzoin ethyl ether, and benzoin isopropyl ether; and benzophenone based photopolymerization initiators such as benzophenone and benzoyl benzoic acid.

The content of the ultraviolet polymerization initiator in the adhesive is preferably equal to or more than 0.1 part by mass and equal to or less than 10 parts by mass, more preferably equal to or more than 2.5 parts by mass and equal to or less than 5 parts by mass with respect to 100 parts by mass of the adhesive resin.

The thickness of the peelable adhesive layer is not particularly limited, and is preferably equal to or more than 1 μm and equal to or less than 100 μm, more preferably equal to or more than 3 μm and equal to or less than 50 μm, for example.

The peelable adhesive layer may be formed, for example, by applying an adhesive coating solution on the heat-resistant resin layer 10 or the flexible resin layer 20.

As a method for applying the adhesive coating solution, coating methods in the known related art such as a roll coater method, a reverse roll coater method, a gravure roll method, a bar coat method, a comma coater method, and a die coater method can be adopted. The drying condition of the applied adhesive is not particularly limited, and it is typically preferable to dry in the temperature range of 80° C. to 200° C. for 10 seconds to 10 minutes. It is more preferable to dry at 80° C. to 170° C. for 15 seconds to 5 minutes. In order to sufficiently accelerate the crosslinking reaction between the crosslinking agent and the adhesive, heating may be performed at 40° C. to 80° C. for about 5 to 300 hours after the drying of the adhesive coating solution is completed.

Also in the adhesive laminate film 50 according to the present embodiment, the peeling strength between the heat-resistant resin layer 10 and the flexible resin layer 20 can be adjusted by adjusting the surface roughness of the surface of the heat-resistant resin layer 10 on the side in contact with the flexible resin layer 20 and by subjecting the surface thereof to release treatment.

Here, the surface roughness (Ra) of the surface of the heat-resistant resin layer 10 which is in contact with the flexible resin layer 20 as defined by JIS-B0601 is preferably equal to or more than 0.10 μm and equal to or less than 10 μm.

It is also preferable that the surface of the heat-resistant resin layer 10 on the side in contact with the flexible resin layer 20 is subjected to release treatment with a releasing agent such as silicone or polytetrafluoroethylene.

(Flexible Resin Layer)

The flexible resin layer 20 is a layer provided for the purpose of improving properties such as flexibility and stretchability of the adhesive laminate film 50.

By providing the flexible resin layer 20, the stretchability and flexibility of the adhesive laminate film 50 after peeling of the heat-resistant resin layer 10 are improved and the adhesive laminate film 50 is allowed to expand in the in-plane direction in the step (E) of picking up the third semiconductor component 80.

In doing so, since the interval between adjacent third semiconductor components 80 is enlarged, the third semiconductor component 80 can be easily picked up from the adhesive laminate film 50. Furthermore, since the adhesive force between the third semiconductor components 80 and the adhesive resin layer 30 is lowered by the shear stress between the third semiconductor components 80 and the adhesive resin layer 30, which is caused by expansion of the adhesive laminate film 50 in the in-plane direction, the third semiconductor components 80 can be picked up from the adhesive laminate film 50.

The flexible resin layer 20 is not particularly limited as long as it can be expanded in the in-plane direction; however, it is preferable to be excellent in properties such as flexibility and stretchability and the like, and to have the heat resistance so as to maintain the adhesiveness between the heat-resistant resin layer 10 and the adhesive resin layer 30 in a case of performing the solder reflow processing.

Examples of the flexible resin constituting the flexible resin layer 20 include one or more selected from polyester elastomer, polyamide elastomer, polyimide elastomer, and polybutylene terephthalate.

According to JIS K7161, the tensile elastic modulus (E') at 160° C. of the flexible resin layer 20 measured under the conditions of a sample width of 10 mm, a distance between chucks of 30 mm, and a pulling rate of 300 ram/min is preferably equal to or more than 1 MPa and equal to or less than 300 MPa and more preferably equal to or more than 5 MPa and equal to or less than 150 MPa. In doing so, favorable characteristics such as flexibility and stretchability of the flexible resin layer 20 can be maintained, and the thermal expansion of the adhesive laminate film 50 in a case of performing the solder reflow processing can further be suppressed.

The melting point of the flexible resin layer 20 is preferably equal to or more than 100° C. and equal to or less than 250° C.

By using such a flexible resin layer 20, deformation of the adhesive laminate film 50 at the time of performing the solder reflow processing can be further suppressed.

The thickness of the flexible resin layer 20 is not particularly limited, and is preferably, for example, equal to or more than 10 μm and equal to or less than 500 μm, more preferably equal to or more than 20 μm and equal to or less than 300 μm, still more preferably equal to or more than 30 μm and equal to or less than 250 μm, and particularly preferably equal to or more than 50 μm and equal to or less than 200 μm.

<Adhesive Resin Layer>

The adhesive resin layer 30 is a layer formed on one surface side of the flexible resin layer 20, and is a layer which comes in contact with and press-sensitively adheres to a surface of a semiconductor substrate in a case where the adhesive laminate film 50 is adhered to the semiconductor substrate.

Examples of the adhesive constituting the adhesive resin layer 30 include a (meth)acrylic adhesive, a silicone adhesive, a urethane adhesive, an olefin adhesive, and a styrene adhesive. Among them, a (meth)acrylic adhesive containing a (meth)acrylic polymer as abase polymer is preferable from the viewpoint of easy adjustment of the adhesive force and the like.

As the adhesive constituting the adhesive resin layer 30, a radiation-crosslinking type adhesive which reduces the adhesive force by radiation can be used. The adhesive resin layer 30 composed of the radiation-crosslinking type adhesive is crosslinked by radiation irradiation and remarkably deteriorates the adhesive force, thus the third semiconductor component 80 can be easily picked up from the adhesive resin layer 30 in the step of picking up third semiconductor component 80. As the radiation, ultraviolet rays, electron beams, and infrared rays, and the like can be mentioned.

As the radiation-crosslinking type adhesive, an ultraviolet-crosslinking type adhesive is preferable.

As the (meth)acrylic polymer contained in the (meth)acrylic adhesive, for example, a homopolymer of a (meth)acrylic acid ester compound and a copolymer of a (meth)acrylic acid ester compound and a comonomer and the like. Examples of the (meth)acrylic acid ester compound include methyl (meth)acrylate, ethyl (meth)acrylate, butyl (meth)acrylate, 2-ethylhexyl (meth)acrylate, hydroxyethyl (meth)acrylate, hydroxypropyl (meth)acrylate, dimethylaminoethyl (meth)acrylate, and glycidyl (meth)acrylate. These (meth)acrylic acid ester compounds may be used singly or in a combination of two or more thereof.

Examples of comonomers constituting the (meth)acrylic copolymer include vinyl acetate, (meth)acrylonitrile, styrene, (meth)acrylic acid, itaconic acid, (meth)acrylamide, methylol (meth)acrylamide, and maleic anhydride. These comonomers may be used singly or in a combination of two or more thereof.

The radiation-crosslinking type adhesive includes, for example, an adhesive such as a (meth)acrylic adhesive, a crosslinking compound (a component having a carbon-carbon double bond), and a photopolymerization initiator, or a thermal polymerization initiator.

Examples of the crosslinking compound include monomers, oligomers, and polymers having a carbon-carbon double bond in the molecule and being crosslinkable by radical polymerization. Examples of such crosslinking compounds include esters of (meth)acrylic acid and polyhydric alcohol such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate; ester (meth)acrylate oligomer; and isocyanurate or isocyanurate compounds such as 2-propenyl-di-3-butenyl cyanurate, 2-hydroxyethyl bis(2-(meth)acryloxyethyl)isocyanurate, tris(2-methacryloxyethyl)isocyanurate.

In a case where the adhesive is a radiation-crosslinking type polymer having a carbon-carbon double bond in the side chain of the polymer, a crosslinking compound may not be added.

The content of the crosslinking compound is preferably from 5 to 900 parts by mass, more preferably from 5 to 100 parts by mass, still more preferably from 10 to 50 parts by mass, with respect to 100 parts by mass of the adhesive. In a case where the content of the crosslinking compound is within the above range, the adhesive force is adjusted more easily compared to in a case of being less than the above range, and the deterioration of storage stability due to too high sensitivity to heat or light is less likely to occur compared to in a case of being larger than the above range.

As the photopolymerization initiator, any compound to which radiation irradiation cleaves a bond and generates radicals may be used. Examples of the photopolymerization initiator include benzoin alkyl ethers such as benzoin methyl ether, benzoin isopropyl ether, and benzoin isobutyl ether; aromatic ketones such as benzyl, benzoin, benzophenone, and α-hydroxycyclohexyl phenyl ketone; aromatic ketals such as benzyl dimethyl ketal; and polyvinyl benzophenone; thioxanthones such as chlorothioxanthone, dodecyl thioxanthone, dimethyl thioxanthone, and diethyl thioxanthone.

Examples of the thermal polymerization initiator include organic peroxide derivatives, and azo polymerization initiators. From the viewpoint that nitrogen is not generated upon heating, an organic peroxide derivative is preferable. Examples of the thermal polymerization initiator include ketone peroxide, peroxyketal, hydroperoxide, dialkyl peroxide, diacyl peroxide, peroxyester, and peroxydicarbonate.

A crosslinking agent may be added to the adhesive. Examples of the crosslinking agent include epoxy compounds such as sorbitol polyglycidyl ether, polyglycerol polyglycidyl ether, pentaerythritol polyglycidyl ether, and diglycerol polyglycidyl ether; aziridine compounds such as tetramethylolmethane tri-β-aziridinyl propionate, trimethylolpropane propionate, N,N'-diphenylmethane-4,4'-bis(1-aziridinecarboxamide), and N,N'-hexamethylene-1,6-bis(1-aziridinecarboxamide); and isocyanate compounds such as tetramethylene diisocyanate, hexamethylene diisocyanate, and polyisocyanate.

The content of the crosslinking agent is preferably equal to or more than 0.1 part by mass and equal to or less than 10 parts by mass with respect to 100 parts by mass of the (meth)acrylic polymer from the viewpoint of improving the balance with heat resistance and adhesion force of the adhesive resin layer 30.

The thickness of the adhesive resin layer 30 is not particularly limited, and preferably equal to or more than 1 μm and equal to or less than 100 μm, more preferably equal to or more than 3 μm and equal to or less than 50 μm, for example.

The adhesive resin layer 30 may be formed, for example, by applying an adhesive coating solution on the flexible resin layer 20.

As a method for applying the adhesive coating solution, coating methods in the known related art such as a roll coater method, a reverse roll coater method, a gravure roll method, a bar coat method, a comma coater method, and a die coater method can be adopted. The drying condition of the applied adhesive is not particularly limited, and it is typically preferable to dry in the temperature range of 80° C. to 200° C. for 10 seconds to 10 minutes. It is more preferable to dry at 80° C. to 170° C. for 15 seconds to 5 minutes. In order to sufficiently accelerate the crosslinking reaction between the crosslinking agent and the adhesive, heating may be performed at 40° C. to 80° C. for about 5 to 300 hours after the drying of the adhesive coating solution is completed.

In the adhesive laminate film 50 according to the present embodiment, a release film may be further stacked on the adhesive resin layer 30. As the release film, for example, a polyester film and the like subjected to release treatment can be mentioned.

The total light transmittance of the adhesive laminate film 50 according to the present embodiment is preferably equal to or more than 85%, more preferably equal to or more than 90%. In doing so, transparency can be imparted to the adhesive laminate film 50. By setting the total light transmittance of the adhesive laminate film 50 to equal to or more than the above-mentioned lower limit value, the adhesive resin layer 30 can be more effectively irradiated with radiation in a case where the adhesive laminate film 50 according to the present embodiment is irradiated with radiation from a side of the heat-resistant resin layer 10, and thus the radiation irradiation efficiency can be improved. The total light transmittance of the adhesive laminate film 50 may be measured according to JIS K 7105 (1981).

Next, an example of a method for manufacturing an adhesive laminate film 50 according to the present embodiment will be described.

First, a flexible resin layer 20 is formed on one surface of the heat-resistant resin layer 10 by an extrusion laminating method. Next, an adhesive coating solution is applied onto the flexible resin layer 20 and dried, whereby the adhesive resin layer 30 is formed, and an adhesive laminate film 50 is obtained.

Further, the heat-resistant resin layer 10 and the flexible resin layer 20 may be prepared by coextrusion molding, or the film-shaped heat-resistant resin layer 10 and the film-shaped flexible resin layer 20 may be prepared by laminating one another.

2. Method for Manufacturing Semiconductor Device

Next, each step of the method for manufacturing a semiconductor device according to the present embodiment will be described.

(Step (A))

First, a structure 100 including an adhesive laminate film 50 having a heat-resistant resin layer 10, a flexible resin layer 20 and an adhesive resin layer 30 in this order and a first semiconductor component 60 adhered to the adhesive resin layer 30 and having a first terminal 65 is prepared.

Examples of the first semiconductor component 60 include one or more semiconductor chips, a semiconductor substrate (for example, a semiconductor wafer), and the like.

In a case where the first semiconductor component 60 includes a semiconductor substrate, the first structure 100 may be produced, for example, by adhering the semiconductor substrate to the adhesive resin layer 30 of the adhesive laminate film 50.

Further, in a case where the first semiconductor component 60 includes one or more semiconductor chips, the first structure 100 be produced, for example, by adhering a semiconductor substrate to the adhesive resin layer 30 of the adhesive laminate film 50 and then dicing the semiconductor substrate on the adhesive laminate film 50 into the semiconductor chip.

Hereinafter, a method for manufacturing the first structure 100 will be described.

First, a semiconductor substrate is adhered to the adhesive resin layer 30 of the adhesive laminate film 50.

Examples of the semiconductor substrate to be adhered to the adhesive laminate film 50 include substrates (for example, wafers) formed of materials such as silicon, germanium, gallium-arsenic, gallium-phosphorus, gallium-arsenic-aluminum, and the like.

Further, as the semiconductor substrate, it is preferable to use a semiconductor substrate having a circuit formed on its surface.

The adhering of the adhesive laminate film 50 may be performed by a human hand, but is usually performed by an automatic adhering apparatus equipped with a roll-shaped surface protective film.

The temperature of the adhesive laminate film 50 and the semiconductor substrate at the time of adhering is not particularly limited and is preferably 25° C. to 80° C.

The pressure between the adhesive laminate film 50 and the semiconductor substrate at the time of adhering is not particularly limited and is preferably 0.3 MPa to 0.5 MPa.

Next, the semiconductor substrate on the adhesive laminate film 50 is diced into the semiconductor chip, if necessary.

"Dicing" referred to here include, (a) an operation of dividing a semiconductor substrate by providing a cut having the same depth as the semiconductor substrate with respect to the semiconductor substrate to obtain a plurality of divided semiconductor chips (hereinafter also referred to as "full cut dicing"), and (b) an operation of obtaining a plurality of semiconductor chips by laser light irradiation to provide a modified region which does not lead to the division of the semiconductor substrate, to the semiconductor substrate (hereinafter also referred to as "stealth dicing").

The dicing may be performed by using a dicing blade (dicing saw), laser light, or the like.

In a case where dicing is a full cut dicing, the semiconductor substrate is divided into a plurality of semiconductor chips by dicing.

On the other hand, in a case where the dicing is a stealth dicing, the semiconductor substrate does not be divided into a plurality of semiconductor chips only by the dicing, the semiconductor substrate is divided by an expansion of the adhesive laminate film 50 after the dicing, and a plurality of divided semiconductor chips are obtained. The expansion of the adhesive laminate film 50 in a case of stealth dicing may be performed before the step (B) or after the step (B).

Note that the first semiconductor component 60 in the step (A) includes both of the plurality of divided semiconductor chips obtained by the full cut dicing and the plurality of semiconductor chips before the division obtained by the stealth dicing.

(Step (B))

Next, solder reflow processing is performed on the first structure 100 in a state where the first semiconductor component 60 is adhered to the adhesive resin layer 30.

In the step (B), a second structure 200 may be obtained by bonding a solder bump 68 to the first terminal 65 of the first semiconductor component 60, and the second structure 200 may be obtained by bonding a second terminal 75 of a second semiconductor component 70 which is separately prepared to the first terminal 65 of the first semiconductor component 60 via the solder bump 68.

Examples of the second semiconductor component 70 having the second terminal 75 include one or more semiconductor chips, a semiconductor substrate (for example, a semiconductor wafer), and the like.

In the step (B), the solder reflow processing can be performed, for example, under a temperature environment equal to or more than 180° C. and equal to or less than 300° C.

The solder reflow processing is not particularly limited, but may be performed using a well-known reflow furnace 90.

(Step (C))

Next, the heat-resistant resin layer 10 is peeled from the adhesive laminate film 50 after the step (B).

Peeling of the adhesive laminate film 50 may be performed by a hand, but is typically performed by an apparatus called an automatic peeling machine.

(Step (D))

Figure 2:
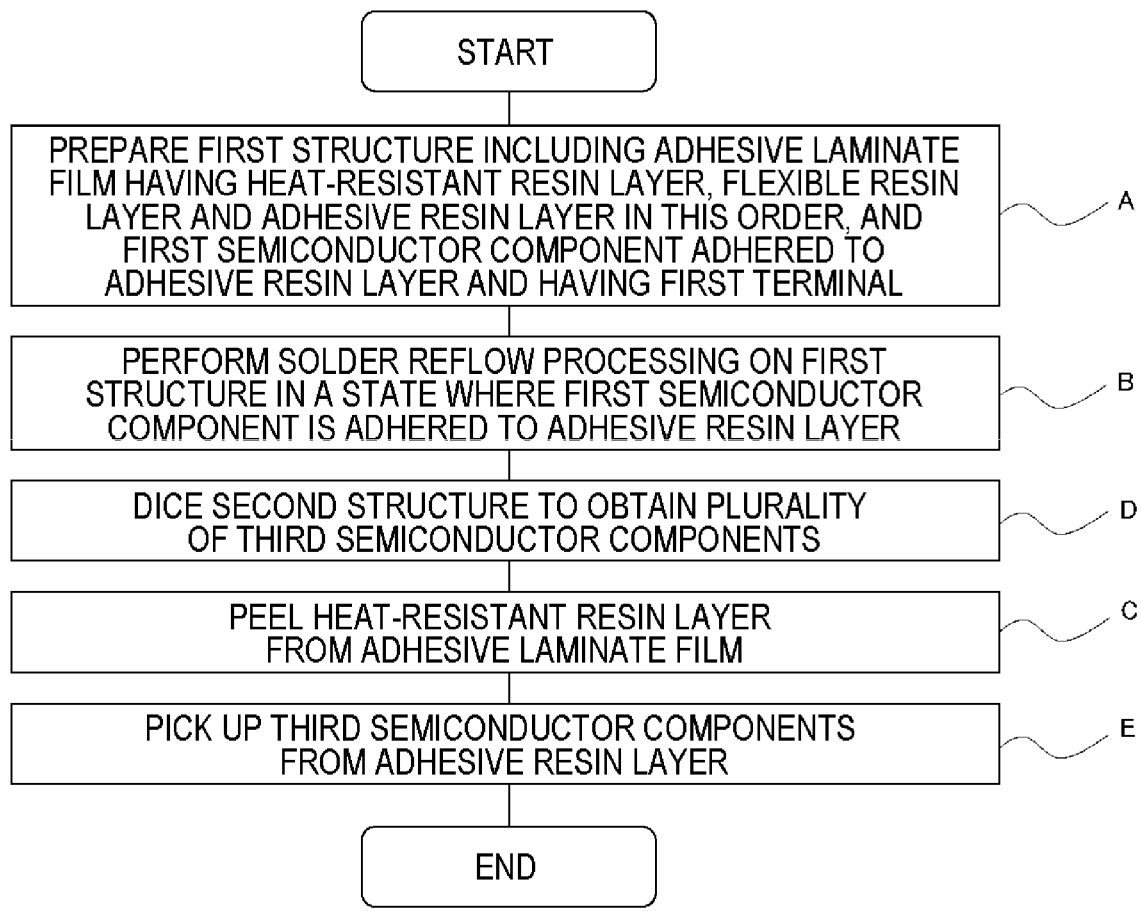
FIG. 2 is a flowchart showing an example of a method for manufacturing a semiconductor device according to the present invention.

In the method for manufacturing a semiconductor device according to the present embodiment, in a case where the first semiconductor component 60 includes a semiconductor substrate, it is preferable to further includes a step (D) of, between the step (B) and the step (C), dicing the second structure 200 to obtain a plurality of third semiconductor components 80, as shown in FIGS. 2 and 6.

Alternatively, in a case where the first semiconductor component 60 includes one or more semiconductor chips and thus plural second structures 200 are obtained, the step of dicing the second structure 200 may be omitted. In this case, the second structures 200 correspond to the third semiconductor components 80.

(Step (E))

Next, after the step (C), the third semiconductor component 80 is picked up from the adhesive resin layer 30.

By this pickup, the third semiconductor component 80 can be peeled from the adhesive laminate film 50.

The third semiconductor component 80 can be picked up by a known method.

In step (E), in a state in which the region to which the third semiconductor components 80 are adhered in the adhesive resin layer 30 is expanded in the in-plane direction of the film and the interval between adjacent third semiconductor components 80 is enlarged, it is preferable to pick up the third semiconductor component 80 from the adhesive resin layer 30.

In doing so, since the interval between adjacent third semiconductor components 80 is enlarged, the third semiconductor component 80 can be easily picked up from the adhesive laminate film 50. Furthermore, since the adhesive force between the third semiconductor component 80 and the adhesive resin layer 30 is lowered by the shear stress between the third semiconductor component 80 and the adhesive resin layer 30, which is caused by expansion of the adhesive laminate film 50 in the in-plane direction, the third semiconductor component 80 can be picked up from the adhesive laminate film 50.

(Step (F))

Figure 3:
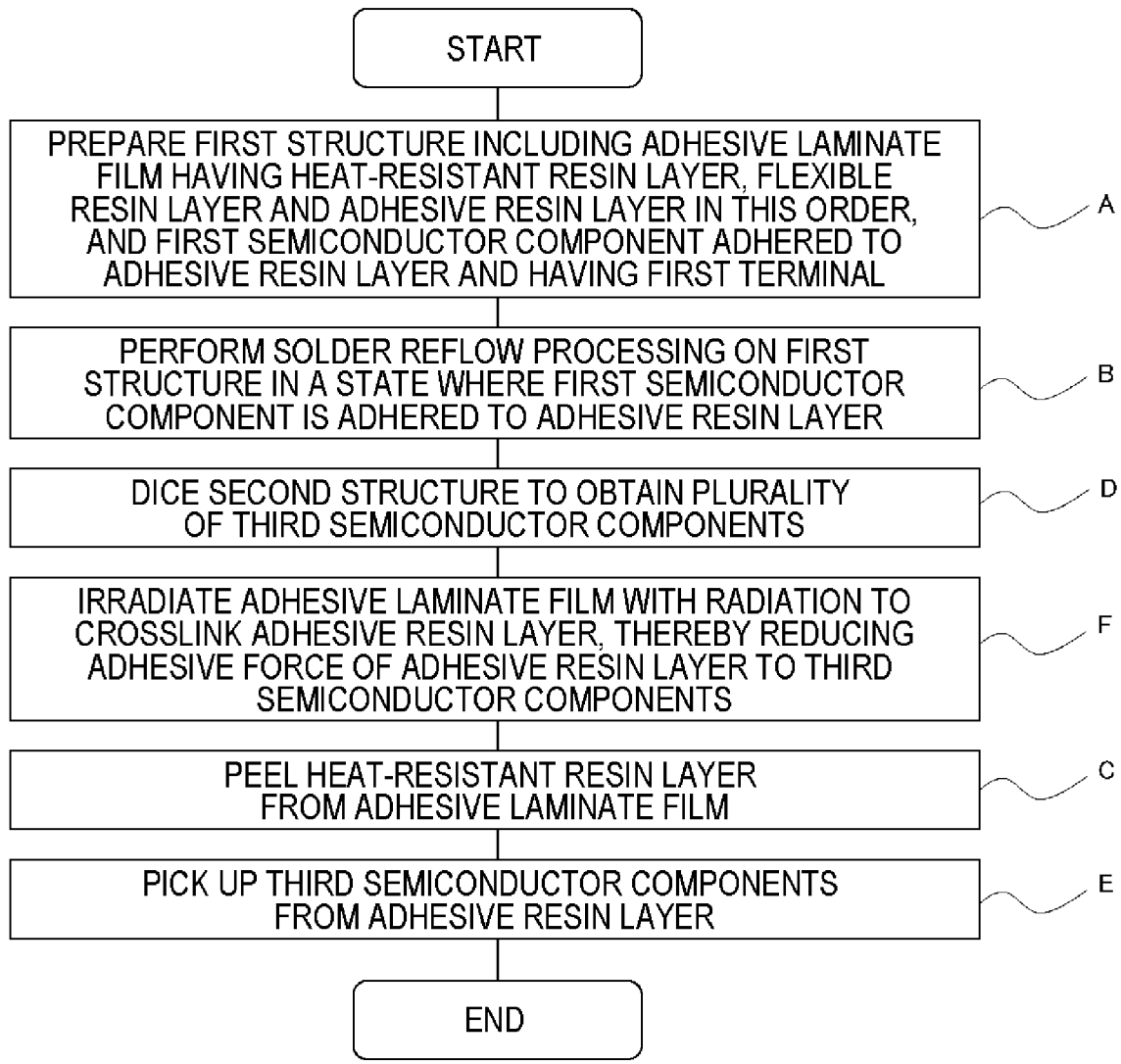
FIG. 3 is a flowchart showing an example of a method for manufacturing a semiconductor device according to the present invention.

In the method for manufacturing a semiconductor device according to the present embodiment, it is preferable to further include a step (F) of, between the step (B) and the step (E), irradiating the adhesive laminate film 50 with a radiation to crosslink the adhesive resin layer 30, thereby reducing adhesive force of the adhesive resin layer 30 to the third semiconductor component 80, as shown in FIG. 3.

By carrying out the step (F), the third semiconductor component 80 can easily picked up from the adhesive resin layer 30. Further, a surface of the third semiconductor component 80 can be prevented from being polluted by adhesive components constituting the adhesive resin layer 30.

The radiation is irradiated, for example, from a side of the heat-resistant resin layer 10 of the adhesive laminate film 50.

In a case of using ultraviolet rays as radiation, the irradiation dose of ultraviolet rays of the adhesive laminate film 50 is preferably equal to or more than 100 mJ/cm$^2$ and more preferably equal to or more than 350 mJ/cm$^2$.

In a case where the irradiation does of ultraviolet rays is equal to or more than the lower limit, the adhesive force of the adhesive resin layer 30 can be sufficiently reduced. As a result, adhesive residue is efficiently prevented from occurring on a surface of the semiconductor component.

The upper limit of the irradiation dose of ultraviolet rays of the adhesive laminate film 50 is not particularly limited, and is, for example, equal to or less than 1500 mJ/cm$^2$, preferably equal to or less than 1200 mJ/cm$^2$ from the viewpoint of productivity.

Ultraviolet radiation may be performed using, for example, a high pressure mercury lamp or an LED.

The step (F) may be carried out before the step (C) or after the step (C). However, it is preferable to carry out the step (F) between the step (D) and the step (C), or between the step (C) and the step (E).

(Step (G))

Figure 4:
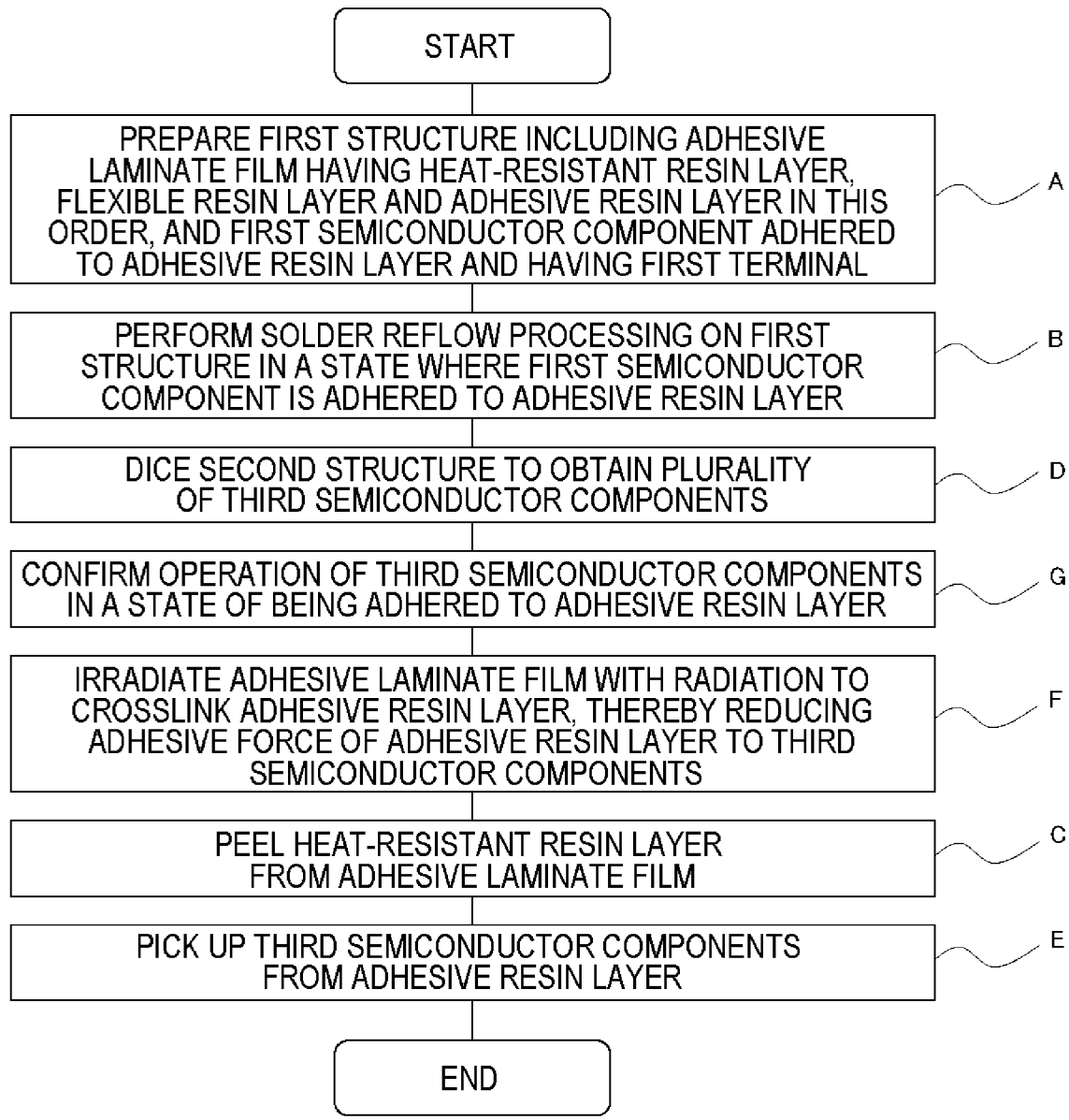
FIG. 4 is a flowchart showing an example of a method for manufacturing a semiconductor device according to the present invention.

In the method for manufacturing a semiconductor device according to the present embodiment, it is preferable to further include a step (G) of, between the step (B) and the step (C), confirming an operation of the third semiconductor components 80 in a state of being adhered to the adhesive resin layer 30, as shown in FIG. 4.

For example, the operation confirmation of the third semiconductor component 80 may be performed by placing the adhesive laminate film 50 to which the third semiconductor component 80 is adhered on the inspection table and using a known semiconductor test apparatus.

For example, a contact terminal connected to the tester is brought into contact with an electrode of the third semiconductor component 80. As a result, an operation power, an operation test signal, and the like are exchanged between the third semiconductor component 80 and the tester to determine whether operation characteristics of the third semiconductor component 80 are good or bad.

The step (G) may be before or after the step (F).

In step (G), it is preferable to confirm the operation of the third semiconductor component 80 under a temperature environment equal to or less than 0° C. or equal to or more than 50° C. and equal to or less than 200° C., more preferable to confirm the operation of the third semiconductor component 80 under a temperature environment equal to or more than 60° C. and equal to or less than 180° C., and still more preferable to confirm the operation of the third semiconductor component 80 under a temperature environment equal to or more than 80° C. and equal to or less than 160° C. In doing so, it is possible to accelerate a deterioration of the third semiconductor component 80 in which a factor that may cause a defect is present, to cause an initial defect of the third semiconductor component 80 at an early stage, and to remove the defective product. As a result, the third semiconductor component 80 with excellent reliability with high yield can be obtained.

For example, the temperature environment can be set by placing the adhesive laminate film 50 to which the third semiconductor component 80 is adhered in a constant temperature reservoir or an oven or heating the structure with a heater provided on the inspection table or the like.

In the method for manufacturing a semiconductor device according to the present embodiment, by performing the above step (G) using the adhesive laminate film 50 having the heat-resistant resin layer 10, deformation and melting of the adhesive resin layer 30 are suppressed due to the heat-resistant resin layer 10, and the positional deviation of the third semiconductor component 80 can be suppressed, whereby precise picking up of the third semiconductor component 80 in step (E) is realized.

(Other Steps)

The method for manufacturing a semiconductor device according to the present embodiment may include other steps than those described above. As other steps, known steps in a method for manufacturing a semiconductor device may be performed.

For example, after performing the step (E), any step typically performed in electronic component manufacturing steps such as a step of mounting the obtained semiconductor component on a circuit board, a wire bonding step, and an encapsulating step may be further performed.

In a case of using a semiconductor substrate having a circuit surface only on one surface as a semiconductor substrate, an encapsulating step for encapsulating the circuit surface of the semiconductor substrate may be further included.

In the encapsulating step, for example, a protective layer is formed on the circuit surface of the semiconductor substrate to which the adhesive laminate film 50 is adhered, thereby encapsulating the circuit surface inside. In that case, the semiconductor substrate whose circuit surface is sealed is diced in the dicing step after the encapsulating step.

Note that the encapsulating step may be performed before the step of adhering the adhesive laminate film 50 to the semiconductor substrate.

In a case of using a semiconductor substrate having a circuit surface, for example, a step of forming electrodes on a circuit formation surface of a semiconductor substrate by any typically employed method and forming a protective film on a non-circuit surface may be further included. The manufacturing method including the steps of forming the electrode and forming the protective film is also called a Wafer Level Package (WLP).

Further, a step of forming a redistribution layer on the circuit surface of the semiconductor substrate may be further included. A semiconductor device obtained by forming the redistribution layer in a wide area that exceeds the semiconductor chip area is also called a fan-out package.

Although the embodiments of the present invention have been described above, these are examples of the present invention, and various configurations other than those described above may also be adopted.

The present invention is not limited to the above-described embodiments, and variations, improvements, and the like within the scope of achieving the object of the present invention are included in the present invention.

This application claims priority based on Japanese Patent Application No. 2016-068859 filed on Mar. 30, 2016, the disclosure of which is incorporated herein in its entirety.

The invention claimed is:

1. A method for manufacturing a semiconductor device comprising:

(A) a step of preparing a first structure including an adhesive laminate film having a heat-resistant resin layer, a flexible resin layer and an adhesive resin layer in this order, and a first semiconductor component adhered to the adhesive resin layer and having a first terminal;

(B) a step of performing solder reflow processing on the first structure in a state where the first semiconductor component is adhered to the adhesive resin layer; and (C) a step of, after the step (B), peeling the heat-resistant resin layer from the adhesive laminate film.

2. The method for manufacturing a semiconductor device according to claim 1, wherein the step (B) comprises a step of obtaining a second structure by bonding a solder bump to the first terminal of the first semiconductor component.

3. The method for manufacturing a semiconductor device according to claim 2,
wherein the step (B) comprises a step of obtaining the second structure by bonding a second terminal of a second semiconductor component which is separately prepared to the first terminal of the first semiconductor component via the solder bump.

4. The method for manufacturing a semiconductor device according to claim 2,
wherein in the step (B), the solder reflow processing is performed under a temperature environment equal to or more than 180° C. and equal to or less than 300° C.

5. The method for manufacturing a semiconductor device according to claim 2,
wherein the first semiconductor component includes a semiconductor substrate, and
the method further comprises (D) a step of, between the step (B) and the step (C), dicing the second structure to obtain a plurality of third semiconductor components.

6. The method for manufacturing a semiconductor device according to claim 5, further comprising:
(E) a step of, after the step (C), picking up the third semiconductor components from the adhesive resin layer.

7. The method for manufacturing a semiconductor device according to claim 2,
wherein the second structure includes a plurality of third semiconductor components, and
the method further comprises (E) a step of, after the step (C), picking up the third semiconductor components from the adhesive resin layer.

8. The method for manufacturing a semiconductor device according to claim 6, further comprising:
(F) a step of, between the step (B) and the step (E), irradiating the adhesive laminate film with a radiation to crosslink the adhesive resin layer, thereby reducing adhesive force of the adhesive resin layer to the third semiconductor components.

9. The method for manufacturing a semiconductor device according to claim 6,
wherein in the step (E), in a state where a region to which the third semiconductor components are adhered in the adhesive resin layer is expanded in an in-plane direction of the film to enlarge an interval between the third semiconductor components adjacent to each other, the third semiconductor components are picked up from the adhesive resin layer.

10. The method for manufacturing a semiconductor device according to claim 5, further comprising:
(G) a step of, between the step (B) and the step (C), confirming an operation of the third semiconductor components in a state of being adhered to the adhesive resin layer.

11. The method for manufacturing a semiconductor device according to claim 1,
wherein a melting point of the heat-resistant resin layer is equal to or more than 200° C., or the heat-resistant resin layer has no melting point.

12. The method for manufacturing a semiconductor device according to claim 1,
wherein a melting point of the flexible resin layer is equal to or more than 100° C. and equal to or less than 250° C.

13. The method for manufacturing a semiconductor device according to claim 1,
wherein the heat-resistant resin constituting the heat-resistant resin layer contains one or more selected from the group consisting of polyimide, polyamide, and polyester.

14. The method for manufacturing a semiconductor device according to claim 1,
wherein the flexible resin constituting the flexible resin layer contains one or more selected from the group consisting of a polyester elastomer, a polyamide elastomer, a polyimide elastomer, and a polybutylene terephthalate.

15. The method for manufacturing a semiconductor device according to claim 1,
wherein the adhesive constituting the adhesive resin layer contains one or more selected from a (meth)acrylate adhesive, a silicone adhesive, a urethane adhesive, an olefin adhesive, and a styrene adhesive.

16. The method for manufacturing a semiconductor device according to claim 1,
wherein a total light transmittance of the adhesive laminate film is equal to or more than 85%.

* * * * *